US006968489B2

(12) United States Patent
Motika et al.

(10) Patent No.: US 6,968,489 B2
(45) Date of Patent: Nov. 22, 2005

(54) PSEUDO RANDOM OPTIMIZED BUILT-IN SELF-TEST

(75) Inventors: Franco Motika, Hopewell Junction, NY (US); Timothy J. Koprowski, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 528 days.

(21) Appl. No.: 10/055,275

(22) Filed: Jan. 23, 2002

(65) Prior Publication Data

US 2003/0140293 A1 Jul. 24, 2003

(51) Int. Cl.[7] .......................... G01R 31/28; G06F 11/00
(52) U.S. Cl. ........................ 714/728; 714/729; 714/739
(58) Field of Search ................................ 714/728, 729, 714/739

(56) References Cited

U.S. PATENT DOCUMENTS 4,687,988 A * 8/1987 Eichelberger et al. ..... 324/73.1
5,612,963 A * 3/1997 Koenemann et al. ....... 714/739

* cited by examiner

*Primary Examiner*—Joseph D. Torres
(74) *Attorney, Agent, or Firm*—Lynn L. Augspurger; James E. Murray

(57) ABSTRACT

Flat pseudo random test patterns are provided in combination with weighted pseudo random test patterns so that the weight applied to every latch in a LSSD shift register (SR) chain can be changed on every cycle. This enables integration of on-chip weighted pattern generation with either internal or external weight set selection. WRP patterns are generated by a tester either externally or internally to a device under test (DUT) and loaded via the shift register inputs (SRIs or WPIs) into the chip's shift register latches (SRLs). A test (or LSSD tester loop sequence) includes loading the SRLs in the SR chains with a WRP, pulsing the appropriate clocks, and unloading the responses captured in the SRLs into the multiple input signature register (MISR). Each test can then be applied multiple times for each weight set, with the weight-set assigning a weight factor or probability to each SRL.

11 Claims, 8 Drawing Sheets

PSEUDO RANDOM OPTIMIZED BUILT-IN SELF-TEST

CROSS REFERENCE TO RELATED PATENTS

U.S. Pat. No. 4,503,537 of common assignee herewith, issued Mar. 5, 1985, and incorporated herein by reference.

U.S. Pat. No. 4,513,418 of common assignee herewith, issued Apr. 23, 1985, and incorporated herein by reference.

U.S. Pat. No. 4,688,223 of common assignee herewith, issued Aug. 18, 1987, and incorporated herein by reference.

U.S. Pat. No. 4,745,355 of common assignee herewith, issued May 17, 1988, and incorporated herein by reference.

U.S. Pat. No. 4,801,870 of common assignee herewith, issued Jan. 31, 1989, and incorporated herein by reference.

U.S. Pat. No. 5,983,380 of common assignee herewith, issued Nov. 9, 1999 and incorporated herein by reference.

FIELD OF THE INVENTION

This invention relates to integrated circuits having logic circuits and self-test circuits for testing the logic circuits and methods performed in integrated circuits for testing the logic circuits.

BACKGROUND OF THE INVENTION

BIST (Built In Self Test), WRP (Weighted Random Pattern), and deterministic pattern test methodologies have evolved mainly in support of LSSD logic and structural testing, which is today the prevailing main design and test approach. FIG. 1 illustrates a typical testing system and chip design that incorporates these test methodologies. This structure utilizes a Linear Feedback Shift Register (LFSR) 12 which applies test vectors by the LFSR 12 to shift register chains 128 to 136 in an integrated circuit device under test (DUT) 14. The outputs of the shift register chains DUT 14 are inputted into a Multiple Input Shift Register (MISR) 16.

These test methodologies allow for three distinct test modes. The first mode is based on deterministic LSSD and test techniques as shown and described in U.S. Pat. No. 3,783,254. It is fully compatible with the original structural test modes used since the early development of LSSD. In this mode the tester supplies the patterns to be loaded in each SRL (Shift Register Latches) chain and then pulses the appropriate system clocks. The problem encountered with this approach is that the generation and storage (at the tester) of the deterministic patterns is relatively expensive.

To overcome this problem, the WRP methodology was developed. This second test mode utilizes a Linear Feedback Shift Register (LFSR) to algorithmically generate a set of pseudo random test patterns at the tester as shown and described in U.S. Pat. Nos. 4,688,223, 4,745,355 and 4,801,870. These patterns are then biased or weighted to optimize them for a specific logic design. In addition, a Multiple Input Signature Register (MISR) is used to compress the DUT responses into a signature for eventual comparison to a predetermined good signature. Although this approach has advantages in test pattern volumes and generation cost, it requires special tester hardware.

The third test mode is based on extending some of these techniques to BIST and incorporates the LFSR and MISR in the DUT. The advantage of this approach is that it lessens the dependency on external test hardware support. The problem encountered here is that the patterns generated by the LFSR are "flat random" patterns that usually result in relatively low test coverage or excessive test time.

As shown in FIG. 1, in the above mentioned U.S. Pat. No 5,983,380, the self-test circuits, the pseudo random pattern generator for generating the pseudo random patterns includes weighting circuits 118 to 126 and global weight set select REG's 138 and 142 for weighting pseudo random patterns. The weighting circuits include an input 140 for receiving a weighting instruction for selectively weighting the pseudo random pattern so that the weighting circuit and the pseudo random pattern generator generate a global weighted pseudo random pattern for testing the logic circuits.

BRIEF DESCRIPTIONS OF THE INVENTION

In accordance with the present invention, test apparatus provides both flat pseudo random test patterns in combination with weighted pseudo random test patterns so that the weight applied to every latch in the LSSD chain can be changed on every cycle. This apparatus fully integrates on-chip weighted pattern generation with either internal or external weight selection. With WRP test technology, the WRP patterns are generated by the tester either externally or internally to the DUT and loaded via the shift register inputs (SRIs or WPIs) into the chip's shift register latches (SRLs). A test (or LSSD tester loop sequence) includes loading the SRLs in the SR chains with a WRP, pulsing the appropriate clocks, and unloading the responses captured in the SRLs into the multiple input signature register (MISR). Each test can then be applied multiple times for each weight set, with the weight-set assigning a weight factor or probability to each SRL. The weight factor is typically of binary granularity with probabilities of:

$$p\{\text{"1"}\}=[0, \ldots 1/8, 1/4, 1/2, 3/4, 7/8, \ldots \text{ or } 1] \text{ for similarly for } p\{0\}.$$

With the above arrangement, only specific subsets of SRLs of the LSSD chain need to be weighted with each weight-set. The remaining SRLs, those not included in the weighted subset, can be loaded with "flat" pseudo-random patterns generated by the built-in LFSR. Furthermore, multiple sets of weights and associated with multiple subsets of SRLs can also be used. From "none" to "all" the latches in the array can be modified on each scan shift cycle.

The new concept is compatible with existing test modes and extends the configuration, shown in FIG. 1, by incorporating support functions to: allow individual weighting a subset of SRLs; internally and/or externally apply specific weighting functions; onboard weighted random patterns generation; and combine "flat" pseudo random patterns with weighted and deterministic patterns.

The concept is further based on design and test ground rules that minimize the impact to system performance, circuit overhead, and maintains compatibility to existing structural scan configurations with: minimal impact to system functional paths; no modification to system clocks; transitional fault coverage support; and compatibility with OPCG and LBIST control.

Therefore it is an object of the present invention to provide improved chip testing apparatus. It is another object of the present invention to provide on-chip testing apparatus with improved test pattern capability.

BRIEF DESCRIPTION OF THE DRAWINGS

These and other objects of the present invention can best be understood from the following detailed description of embodiments of the invention while referring to the accompany figures of which.

DETAILED DESCRIPTION OF THE INVENTION

Figure 1:
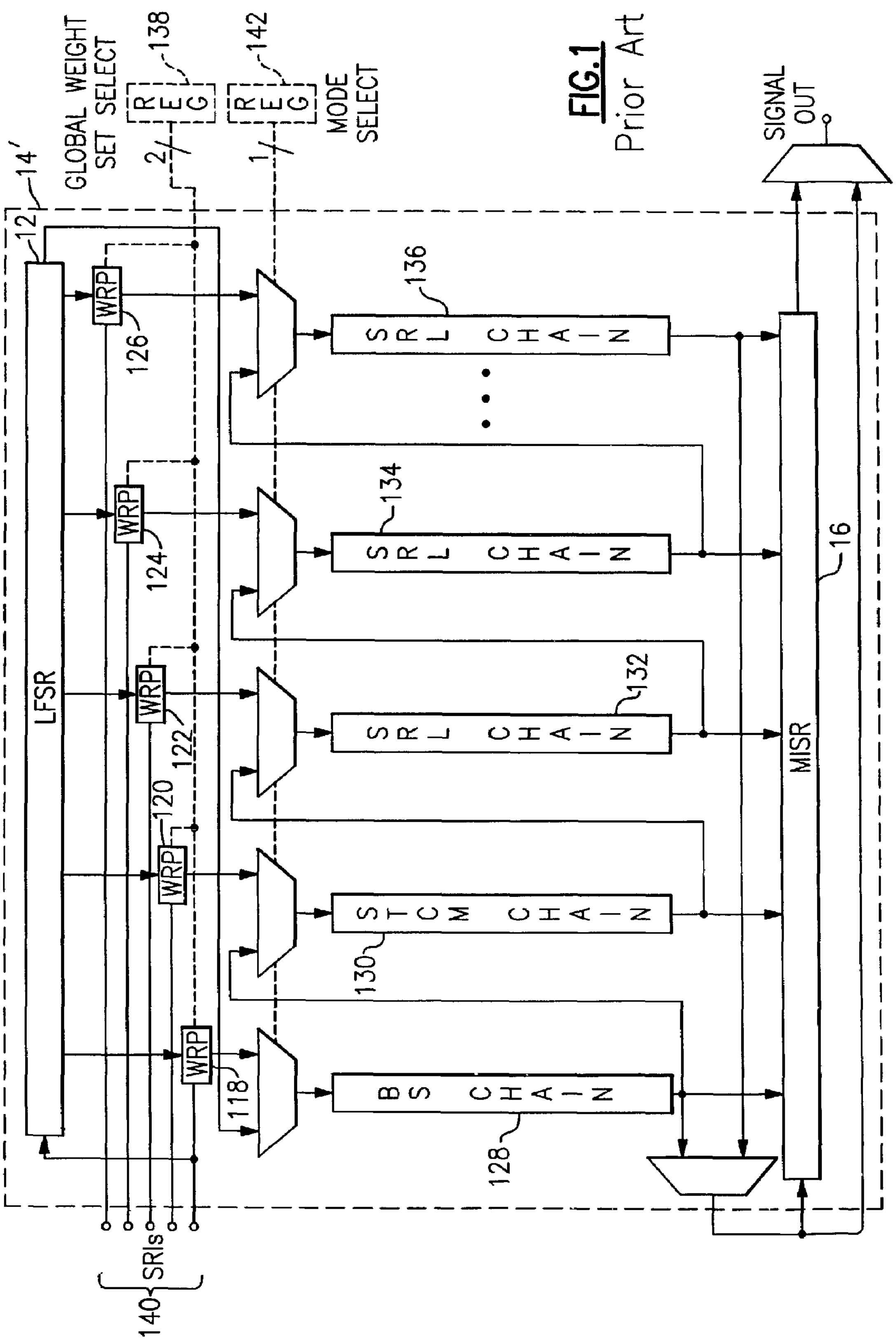
FIG. 1 is a block diagram illustrating a prior art on-chip testing configuration.
Figure 2:
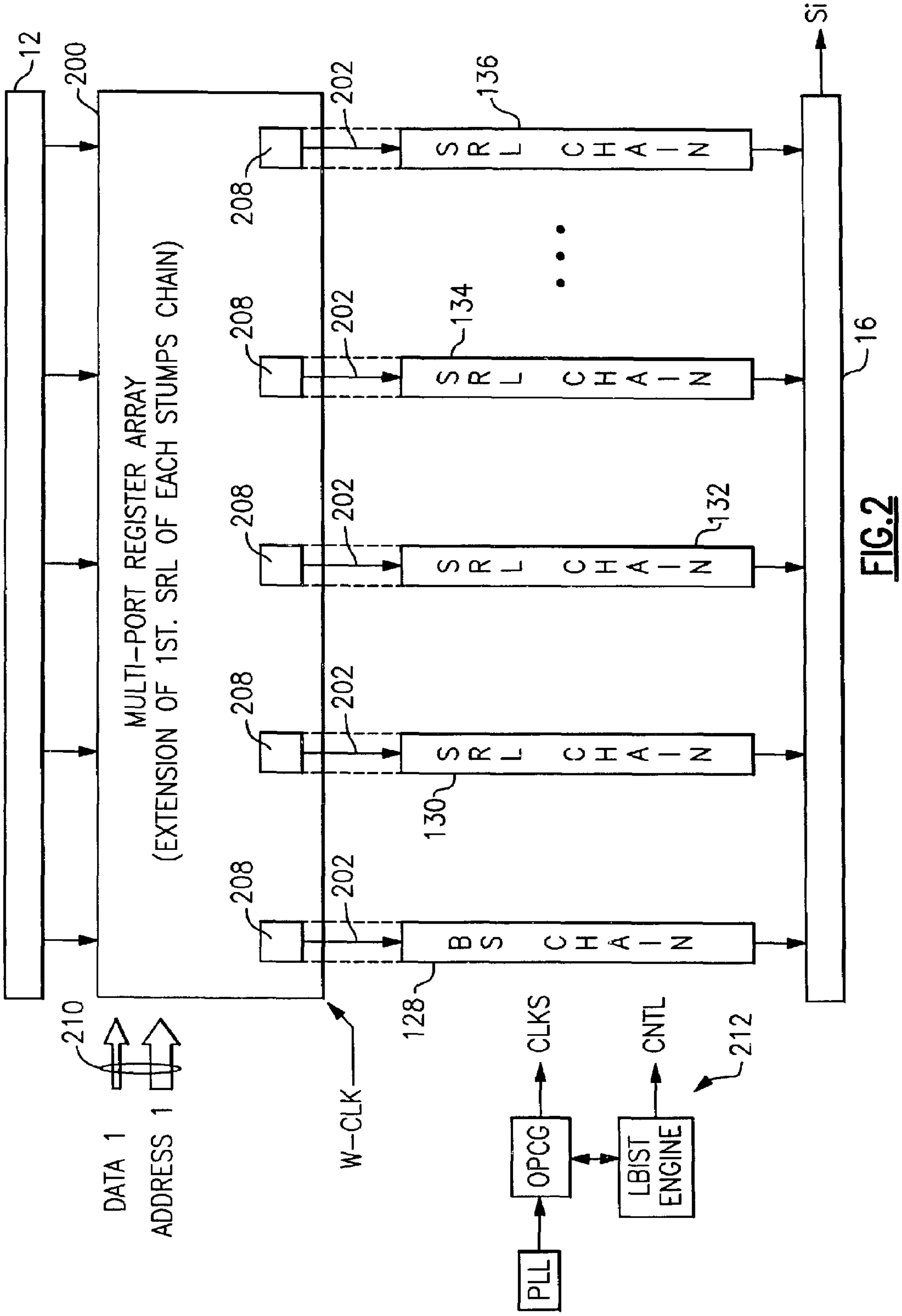
FIG. 2 is a block diagram illustrating an on-chip testing structure according to the present invention.
Figure 3:
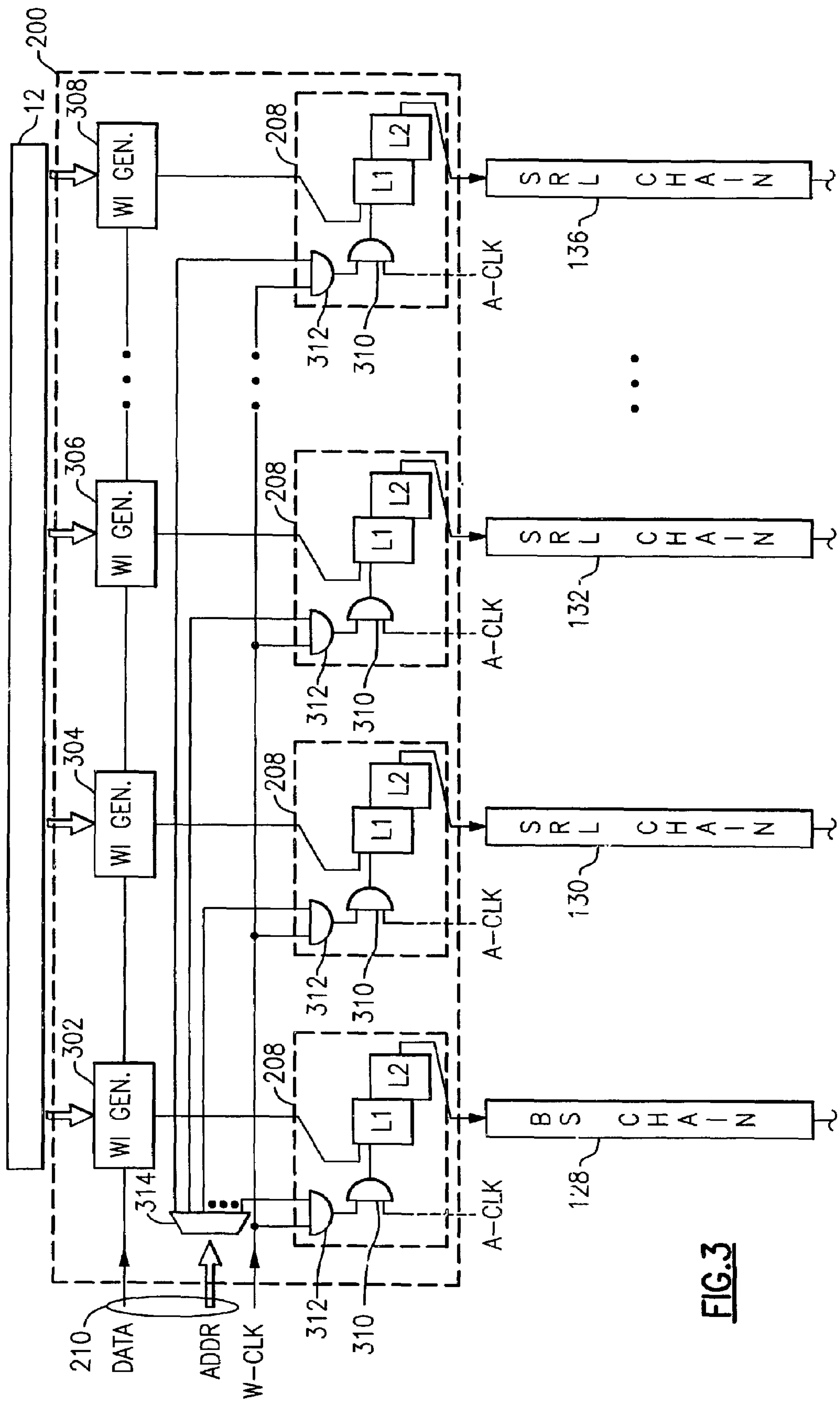
FIG. 3 is a block diagram containing a more detailed view of a multipart register array of the type shown in FIG. 2.
Figure 8:
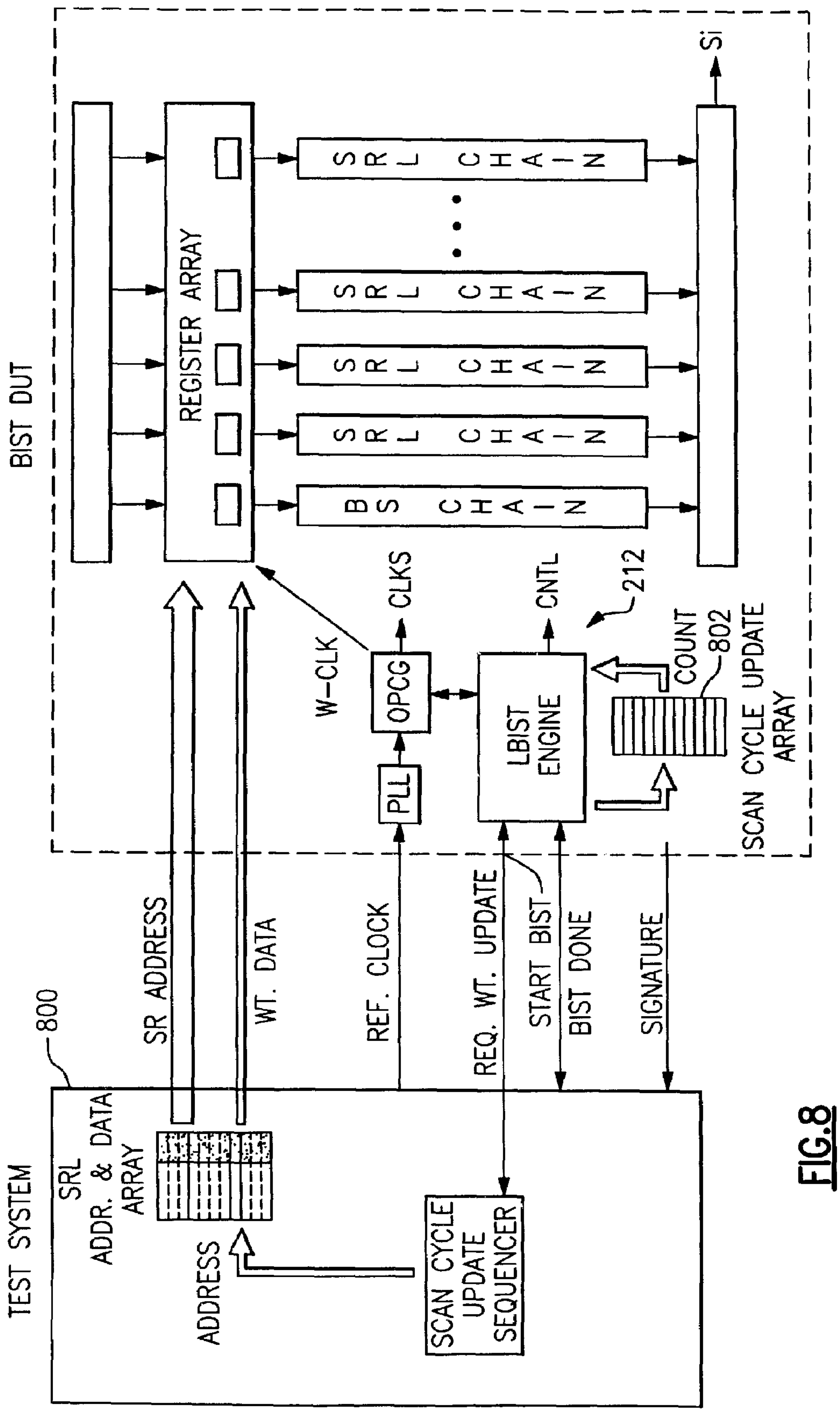
FIGS. 8 and 9 are block diagrams illustrating alternative embodiments to the externally selectable structure of FIG. 3.
Figure 9:
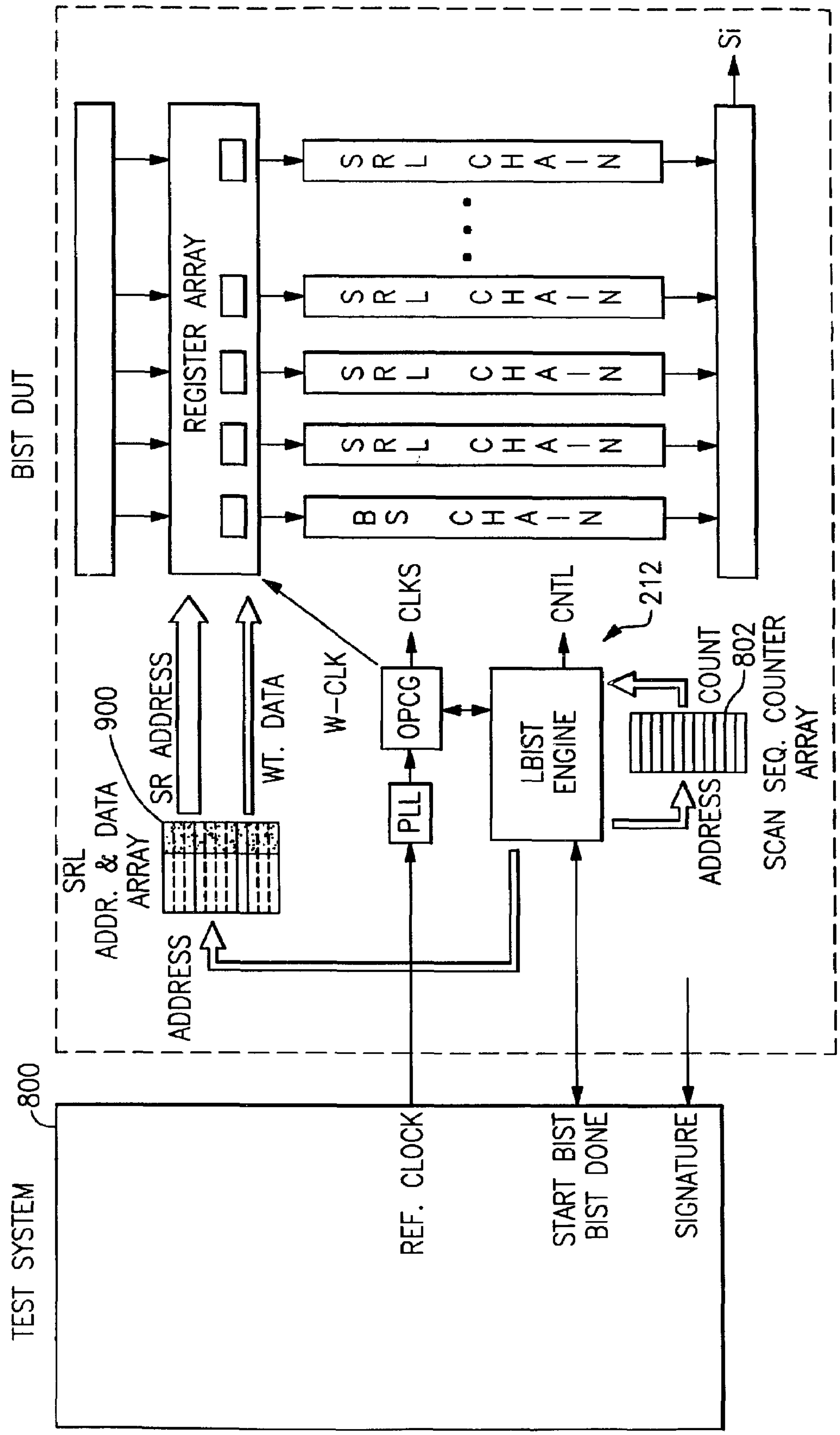

As shown in FIG. 2, a multipath register array 200 is placed between the LFSR and the scan chain inputs 202. The linear feedback shift register (LFSR) 125, the SRLs 128 to 136 and the signature analysis shift register (MISR) 16 remain unchanged from that of FIG. 1. The register array can be an independent memory macro, an array register structure of individual latches 208, as shown here in FIG. 2, or an array structure formed using a first SRL 208 of each scan chain, as shown in FIG. 3. In any case, register array 200 has a storage element for each scan chain 128 to 136 that can be fully loaded directly from the LFSR 125 and individually loaded from the array port 210. As can be seen in FIGS. 2, 8 and 9, test support structure for the LBIST engine 212 can be located off chip, partially on-chip, or fully on chip, respectively. Therefore it can be seen that hardware implementation of the present invention is relatively simple, requires very low circuit overhead, and can be easily incorporated into any number of existing prior art structures including the structure of FIG. 1.

Referring now to FIG. 3, linear feedback shift register 12 is utilized to supply flat pseudo random patterns to weight generators 302, 304, 306 and 308. The output of these feed BS chain 328, STCM chain 320 and SRL chains 332, 334, respectively.

Figure 4:
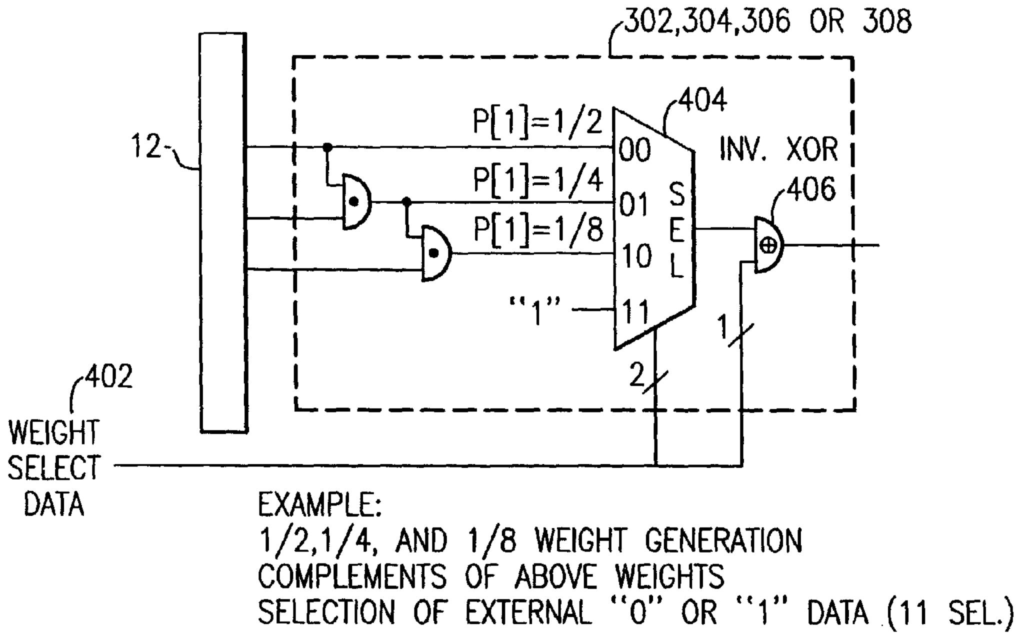
FIG. 4 is a block diagram illustrating the weight selection structures of FIG. 3.

FIG. 4 shows in somewhat more detail the weighted random pattern (WRP) generators supporting each chain 128, 130, 132, and 136. For the purposes of illustration, a configuration with four pairs of WRPs (0,1), (¼, ¾), (⅛, ⅞), and (½, ½) have been selected. Of course one is not limited to only four WRP values nor these specific values. Each WRP, such as generator 302 shown, receives weight select data 402, a weight generator or WRP generation function block, a 4:1 MUX 404 having a selection input tied to register 12 and an XORd circuit 406 to select true or complement values.

Figure 5:
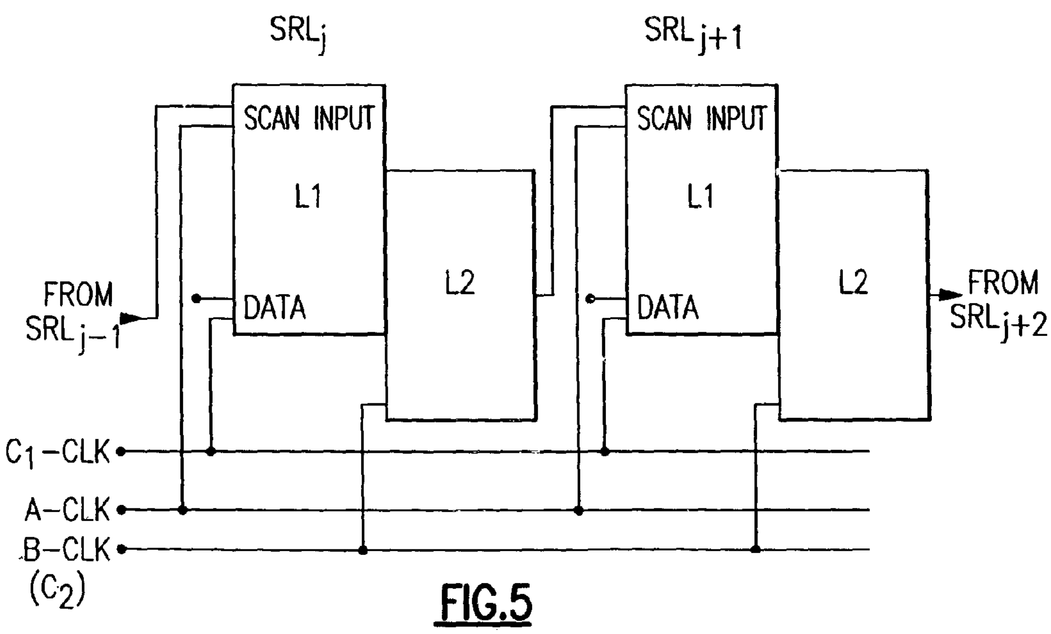
FIG. 5 is a block diagram containing a more detailed view of latches used in FIG. 3.

FIG. 5 is a more detailed view of the latches in any two latches in the scan chains 128 to 136 of FIG. 3. During a data loading operation, the first L1 stage in each latch SRL 1, in each chain is activated by the A-clk through OR circuit 310 to receive data from one of the weighting circuits 302 to 308. The data from the L1 stage of the latch is then transferred to the L2 stage by activation of the b-clk to load all second stages with the data received from the weighting circuits. In addition to this simultaneous loading of all SRL1 latches, each of the latches can be individually changed. For this purpose, each of the SRL1 latches contains an AND circuit 312 which enters data from the latch on the concurrence of the outputs of the address MUX 314 and the w-clock to selectively enter data into any one of the SRL1 latches to enable data to be entered into any latch individually.

Figure 6:
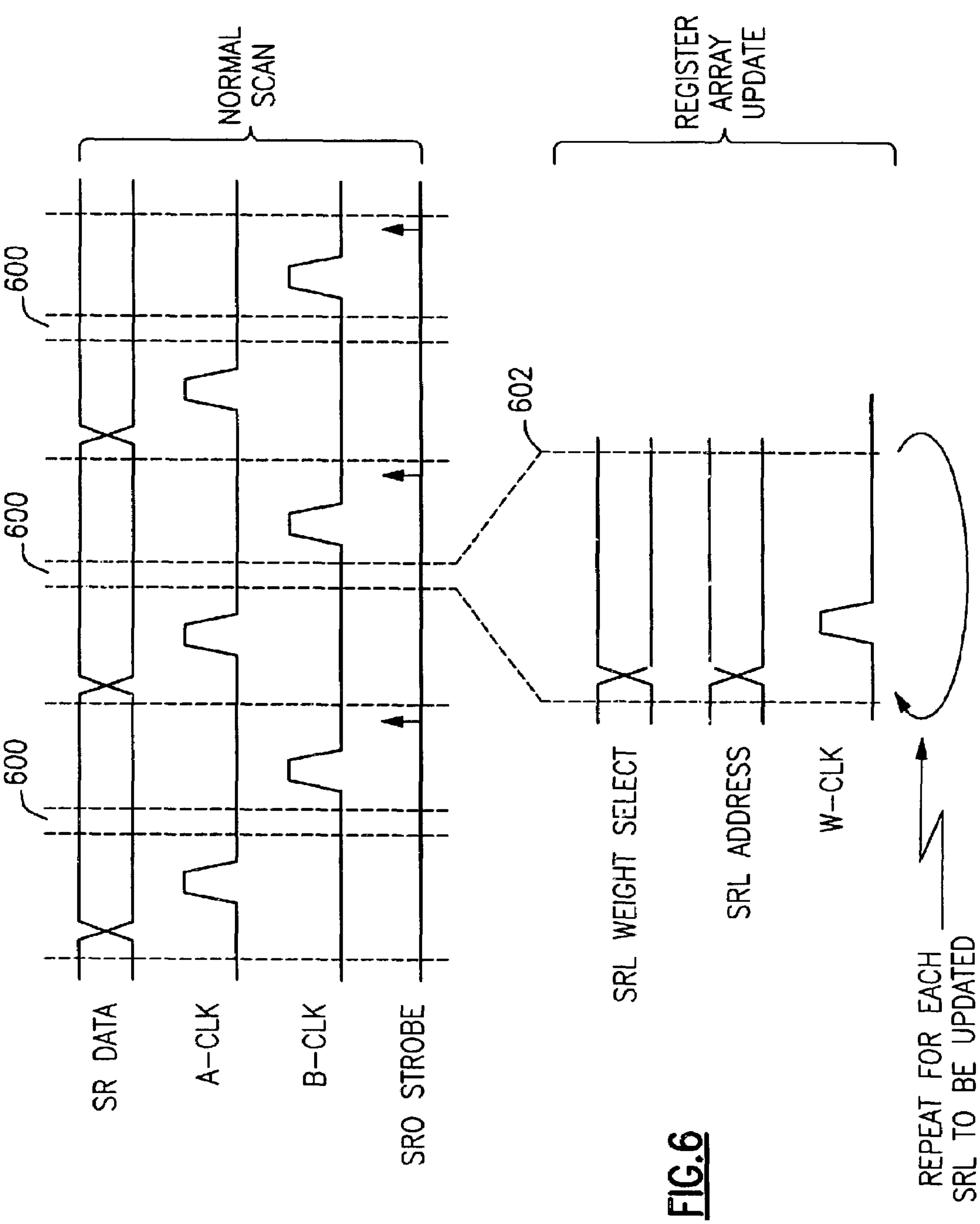
FIG. 6 is a timing diagram for the latches in FIG. 5.

FIG. 6 is a flow diagram showing entry of a typical LSSD scan sequence using the a-clk followed by the b-clk with the additional capability of optionally extending the cycle at location 600 between the a clock and b clock and introducing one or more update cycles using the output of the MUX 314 and the w-clk as shown at 602.

Figure 7:
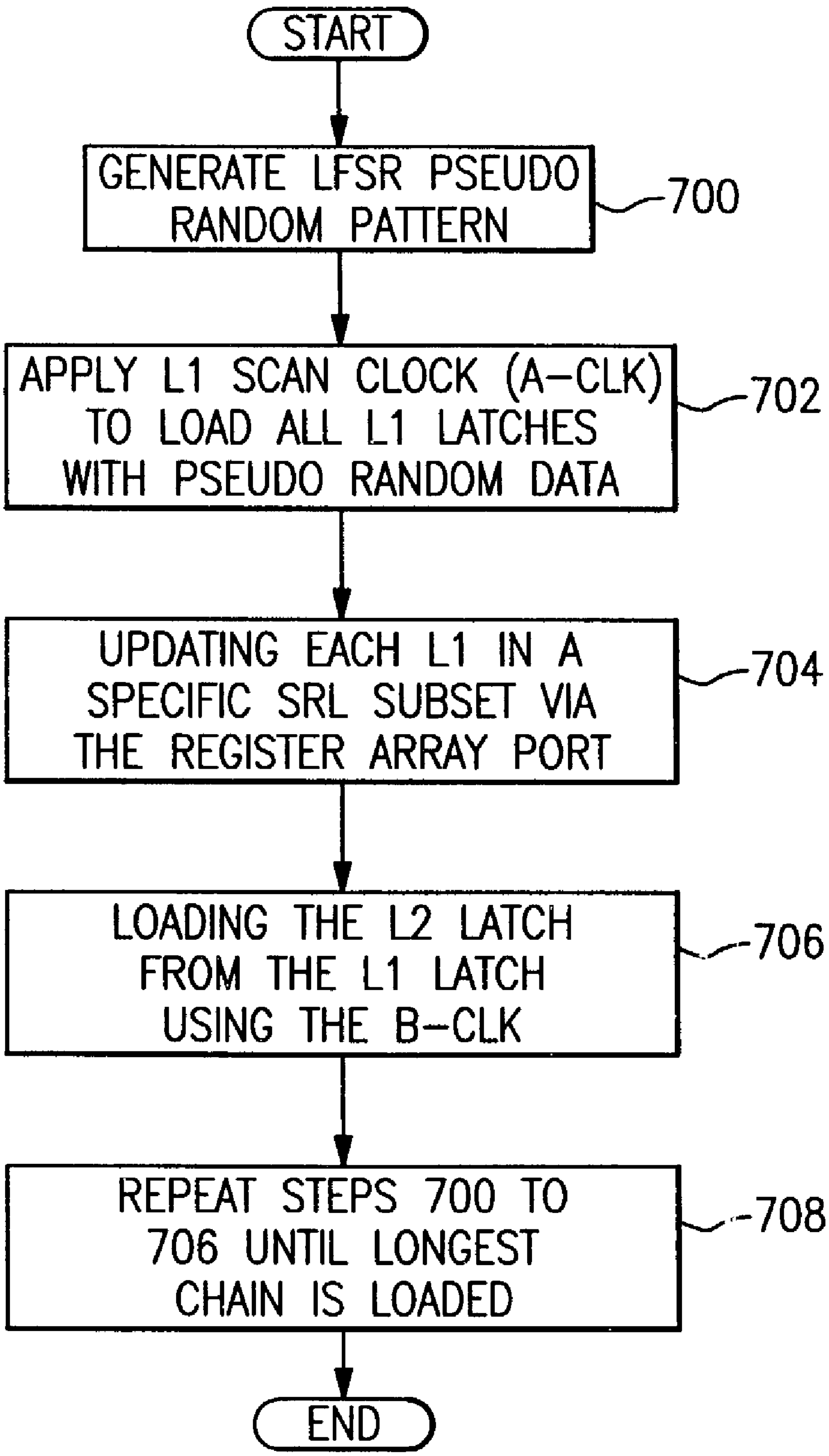
FIG. 7 is a flow diagram illustrating operation of the function of FIG. 3.

As shown from the flow diagram of FIG. 7, the basic loading sequence for the latches is as follows:

1. Generate the next LFSR pseudo random pattern (this can be combined with the previous scan cycle (step 700).
2. Applying the L1 scan clock (a-clk) to load all the L1 latches of the register array with pseudo random data from the LFSR (Step 702).
3. Updating an L1 in any specific SRL1 via the register array port (by addressing the particular L1 latch stage and applying the w-clock (step 704).
4. Loading the L2 latch from the L1 latch (b-clk) (step 706).
5. Repeat steps 700 to 706 until the longest STUMPS scan chain is loaded (step 708).

FIG. 2 depicts the minimal on-chip LBIST engine support and depends on the off-chip test system to provide the scan sequencing control along with the weighted data, SRL addressing, and scan cycle update locations or counts. This is referred to as the "external Mode" since most of the scan data and control is external to the device under test. This approach is compatible with design and test methodologies that do not incorporate full BIST support, but utilize the STUMPS architecture. Furthermore, this approach does not require special tester hardware support, such as WRP to support quasi-weighted random patterns (0, 1, ½ weights).

FIG. 8 depicts a mode that is the combination of external tester support and internal BIST supported functions. This mode is referred to as the "internal-external mode". In this configuration, the internal LBIST engine 212 controls the scan sequence and clocking, while the tester provides the individual SRL update. In this embodiment, the "scan cycle update array" 802 provides the LBIST engine with the scan cycle that requires one or more SRLs to be updated. The LBIST engine 212 stops at each of these scan cycle locations and request the tester 800 to update all the desired SRLs. At completion of the SRL update, the tester restarts the LBIST engine. The tester "scan cycle update sequencer" updates each SRL across the SRL chains by sequencing through the "SR address and data array" and issuing a w-clk on each update cycle.

FIG. 9 depicts the fully LBIST integrated support. This is referred to as the "internal STCM mode" since the data and sequencing function are performed without tester support. In this mode, both the SRL update address and data and the scan cycle location data is pre-loaded in the onboard arrays 802 and 900. The LBIST engine is further modified with an additional comparator that provides the scan cycle stopping capability from the sequencing control for updating the SRLs from the "SR address and data array".

Although we have been discussing the use of this concept for VLSI chips with LBIST structures, the concept can be extended to fully integrated test subsystems. At this level of integration, the subsystem would be capable of self test and self diagnosis leading to dynamic self repair. This could result in significant yield improvements at the uP test level by utilizing redundancy enabling techniques.

Similarly, at the system level the benefit of self diagnosis and self repair would be realized by dynamically reconfiguring the system and thereby minimizing system down time.

A further extension of this concept in a large system environment would be to generate and store the expected signatures at system bring-up time and then invoke them for system diagnosis when required.

The proposed solution is superior to the methods described above because it provides a efficient, consolidated and unique integral solution to the total BIST problem with the following benefits:

- Integrates "flat" LBIST and WRP test methodologies.
- Consolidation into a single test methodology.
- Compatible with existing structural LSSD and LBIST base (STUMPS).
- No effect on the chip cycle time as the functional logic path to the latches is not affected.
- Utilizes existing test system base.
- Usable in system test environment.
- Reduction in weighted random test data volumes.
- Extendibility to fully integrated BIST and
- Decrease the overall test time when integrated with embedded arrays.
- Can execute WRP at system speed.
- Does not require special WRP test system hardware.
- Minimizes software support for diverse ATPG and TDS systems.
- Implementation is relatively simple and requires low circuit overhead.

Furthermore, the concept allows for a simpler design supporting flat random, deterministic, and weighted random pattern test modes.

Although the present invention and its advantages have been described in detail, it should be understood that various changes, substitutions and alterations can be made herein without departing from the spirit and scope of the invention as defined in the appended claims.

What is claimed is:

1. An integrated circuit, comprising logic circuits connected to a plurality of shift register latch scan chains and self-test circuits for testing said logic circuits, said self-test circuits in said integrated circuit comprising:

a pseudo-random pattern generator for generating at least one flat pseudo-random patterns to provide to each of the scan chains;

A plurality of weighting circuits for receipt of the pseudo-random patterns from the pattern geneator, a different one of the weighting circuits associated with each of the scan chains, each weighting circuit having a selectable weight set to provide flat or weighted pseudo-random patterns to the scan chains independently of one another;

a different storage element associated with each of the weighting circuits for receipt and storage of flat and weighted pesudo-random patterns each from its different associated weighting circuit; and a selection circuit for individually addressing each of the storage elements for selective entry of either a flat or weighted pseudo-random pattern into different shift register latches of said scan chains independently of one another for scanning said weighted pattern to said logic circuits to enable provision of pseudo-random patterns of different weights to different shift register latches in the same scan chain.

2. An integrated circuit as recited in claim 1, wherein said weighting circuit comprises a weight generating circuit and a weight selecting circuit.

3. The integrated circuit as recited in claim 1, wherein said weighting circuit includes means for receiving a weighting instruction from an external source to said integrated circuit.

4. The integrated circuit as recited in claim 1, wherein said storage elements are each a first stage of an associated scan chain.

5. The integrated circuit as recited in claim 4, wherein said pseudo-random pattern generator and said weighting patterns, receipts pattern and weighting instructions are from a tester internal to said integrated circuit.

6. The integrated circuit as recited in claim 4, wherein said weighting instruction is generated by a tester external to said integrated circuit.

7. The integrated circuit as recited in claim 4, further comprising a memory or register array wherein at least a portion of said weighting instruction is stored in said memory array.

8. The integrated circuit of claim 1, wherein said pseudo-random pattern generator is a linear feedback shift register coupled to each of the weighting circuits to provide a flat pseudo-random pattern to each of the weighting circuits.

9. The integrated circuit of claim 8, wherein the scan paths contain multiple shift register latch stages $SRL_1$ to $SRL_u$ each with first and second stages which SRL stages are controlled by an A clock, a B clock and a $C_1$ clock.

10. The integrated circuit of claim 9, wherein the first shift register stage SRL of each scan chain functions as said storage element associated with the scan chain and received at its $L_1$ latch an input from the associated weighting circuit, an address input from an address decoder of the selection circuit and a w-clock for separately addresssing each of the scan paths to enable entry of data from an associated weighting circuit into the first stage of the scan path on a SRL by SRL of the scan path basis.

11. The integrated circuit of claim 10 including means performing the following loading sequence steps individually for each of the plurality of scan paths;

generating the next flat or weighted pseudo-random pattern;

aplying the L1 scan clock (A-clk_to load all the L1 Latches of the register array with flat or weight pseudo-random data from the LFSR;

updating an L1 in any specific SRL1 stage scan path by addresssing the particular L1 latch stage and applying thw w-clock;

loading the L2 latch from the L1 latch (B-clk); and repeating all the steps until the longest scan chain is loaded.

* * * * *